(12) United States Patent
Van Assche et al.

(10) Patent No.: US 8,122,079 B2
(45) Date of Patent: Feb. 21, 2012

(54) EVENT COUNTER

(75) Inventors: Gilles Van Assche, Brussels (BE);
Jean-Louis Modave, Ottignies (BE)

(73) Assignee: Proton World International N.V., Zaventem (BE)

(*) Notice: Subject to any disclaimer, the term of this patent is extended or adjusted under 35 U.S.C. 154(b) by 991 days.

(21) Appl. No.: 12/089,056

(22) PCT Filed: Oct. 4, 2006

(86) PCT No.: PCT/EP2006/067046
§ 371 (c)(1),
(2), (4) Date: Apr. 3, 2008

(87) PCT Pub. No.: WO2007/039629
PCT Pub. Date: Apr. 12, 2007

(65) Prior Publication Data
US 2008/0219400 A1 Sep. 11, 2008

(30) Foreign Application Priority Data
Oct. 5, 2005 (FR) .................... 05 53012

(51) Int. Cl.
*G06F 7/50* (2006.01)

(52) U.S. Cl. ............................................. 708/672
(58) Field of Classification Search .................. None
See application file for complete search history.

(56) References Cited

U.S. PATENT DOCUMENTS

| | | | | |
|---|---|---|---|---|
| 5,682,342 A | * | 10/1997 | Suzuki | 708/672 |
| 6,023,771 A | | 2/2000 | Watanabe | |
| 6,507,916 B1 | | 1/2003 | Kerner et al. | |
| 7,861,126 B2 | * | 12/2010 | Love et al. | 714/47.1 |
| 2003/0229660 A1 | * | 12/2003 | Uehara et al. | 708/672 |

FOREIGN PATENT DOCUMENTS
WO  WO 9829813 A  7/1998

OTHER PUBLICATIONS

International Search Report from corresponding International Application No. PCT/EP2006/067046 filed Apr. Oct. 4, 2006.

* cited by examiner

*Primary Examiner* — David H Malzahn
(74) *Attorney, Agent, or Firm* — Wolf, Greenfield & Sacks, P.C.

(57) ABSTRACT

A counting method and a counter using an integrated circuit memory area, including at least one step of storage of partial values in several words of identical memory sizes, the result of the counting being obtained by arithmetically adding the values contained in the different words.

18 Claims, 4 Drawing Sheets

EVENT COUNTER

FIELD OF THE INVENTION

The present invention generally relates to electronic counters and, more specifically, to counters formed by means of a set of memory cells, the respective states of which condition the counter value.

The present invention more specifically applies to so-called event counters which are used to count the number of occurrences of a specific event (for example, the execution of a given step of a program) and having their value exploited in relation to one or several thresholds. These may be for example automobile vehicle odometers.

DISCUSSION OF THE RELATED ART

Event counters, especially in so-called security applications where the correct execution of a program or the number of occurrences of a given operation is for example desired to be monitored, generally exploit a non-volatile memory to store the current value of the counter. This memory is, for example, an EEPROM having its cells updated on each counter incrementation or decrementation.

FIG. 1 is a schematic block diagram of an example of an integrated processor 1 of the type to which the present invention applies. Such an integrated circuit 1 comprises a central processing unit 11 (CPU) which communicates via one or several data, address, and control signal buses 12, with one or several memories 131 (MEM) and 132 (EEPROM) among which at least one non-volatile memory 132. All or part of buses 12 are connected to an input/output circuit 14 (I/O) for communicating with the outside of circuit 1. Functionally, circuit 1 comprises at least one counter 15 (CNT) formed in hardware or software fashion and exploiting an area of non-volatile memory 132 to store the counter value. Circuit 1 is, for example, contained in a smart card.

FIG. 2 very schematically shows a conventional example of a counter 15 using cells of a memory. Such a counter uses a set 132 of cells Ci (for example, n cells, with i ranging between 1 and n) to store the value of the counter over n bits. These cells are accessible in read mode R and in write mode W by a control circuit 151 (CTRL) receiving an increment or decrement instruction INC/DEC originating, for example, from central unit 11 to update the value contained in the cells of set 132. The circuits or programs conditioning the updating of the counter value and exploiting its result may be of various natures.

Circuit 151 provides, after a reading of the cell content, value VAL of the counter. This value is then exploited, for example, to be compared with a threshold to detect a possible overflow of the event counter by an appropriate program. In applications more specifically aimed at by the present invention, the result of the counter value is generally exploited to start a specific action (for example, a blocking of a smart card, the transmission of an alarm signal, etc.) when the counter value reaches a so-called security threshold. This value however generally does not need be accurate to within one unit to detect an operation considered as abnormal in an integrated circuit. Examples of application are the limitation of the number of dialings of a confidential code, the limitation of the number of uses of an application, etc.

The representation of FIG. 2 is functional and simplified. In practice, circuits of cell addressing and selection in a memory plane are required.

A problem linked to the use of memories, especially non-volatile, is that the multiple programmings of the cells of these memories may cause wear and that cells become defective along the product lifetime.

The current solution to solve this problem is to provide so-called redundancy cells to replace cells which have become defective. Such redundancy cells are also used to correct manufacturing defects of the product. A disadvantage is that as the number of used redundancy cells increases, the counter updating time also increases. Conventionally, in non-volatile memories, the writing takes more time than in other memories.

A difficulty is to detect that a cell has become unusable during the product lifetime. This requires periodically testing all the memory plane cells. The cells considered as defective are eliminated from a functional point of view and are no longer used by the integrated circuit.

Another difficulty is to organize the redundancy with specific addressing mechanisms.

A disadvantage of conventional techniques is that they lead to oversizing the memory planes to form event counters, to provide a sufficient redundancy.

Another problem is the processing of possible frauds. Indeed, a cell of an event counter (be it in the volatile or non-volatile memory) may become functionally defective under the effect of attacks aimed at preventing the counter from reaching the threshold from which a specific procedure is implemented. Such attacks may be electric, thermal, or radiation disturbances.

Such attacks are difficult to detect, except if they amount to considering the cell(s) providing erroneous results as defective. In this case, these cells are replaced with redundant cells even though they would be capable of operating properly afterwards (once the disturbance has disappeared). This uselessly consumes redundancy cells.

SUMMARY OF THE INVENTION

The present invention aims at overcoming all or part of the disadvantages of known counters.

The present invention more specifically aims at providing an event counter totally or partly avoiding the use of redundancy cells along the product lifetime.

The present invention also aims at providing a solution capable of taking into account both defective cells and cells temporarily stressed by a fraudulent attack.

The present invention also aims at enabling possible reuse of cells detected as being defective at a given time of the product lifetime.

To achieve all or part of these objects, as well as others, the present invention provides a counting method using a memory area in an integrated circuit, comprising at least one step of storage of partial values in several words of identical sizes of the memory, the result of the counting being obtained by arithmetically adding the values contained in the different words.

According to an embodiment of the present invention, the method comprises the step of incrementing or decrementing one of the words by selecting it so that all the words contain values present within a given range.

According to an embodiment of the present invention, said range is set according to the tolerance desired for the counter result.

According to an embodiment of the present invention, the increment or the decrement is one.

According to an embodiment of the present invention, if a word does not contain one of the range values, an updating of this word to one of these values is attempted.

The present invention also provides an integrated circuit counter comprising a memory area to store the counter value, comprising:

means for comparing partial values contained in different memory words of identical sizes with respect to a range of possible values;

means for assigning to words having their value outside the range one of the values of this range; and means for arithmetically summing the respective values of the words to provide the counter value.

According to an embodiment of the present invention, the range of values is selected according to the maximum interval desired between the resulting values of the counter.

The foregoing and other objects, features, and advantages of the present invention will be discussed in detail in the following non-limiting description of specific embodiments in connection with the accompanying drawings.

DETAILED DESCRIPTION

Figure 1:
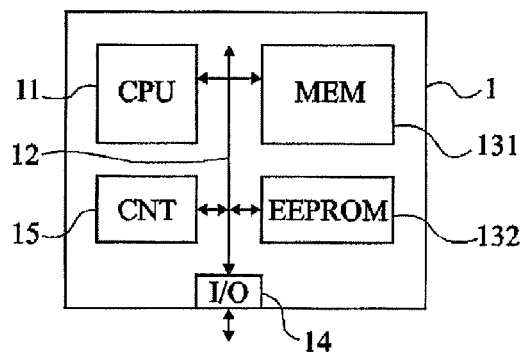
FIG. 1, previously described, very schematically shows in the form of blocks an example of an integrated processor comprising a counter of the type to which the present invention applies.
Figure 2:
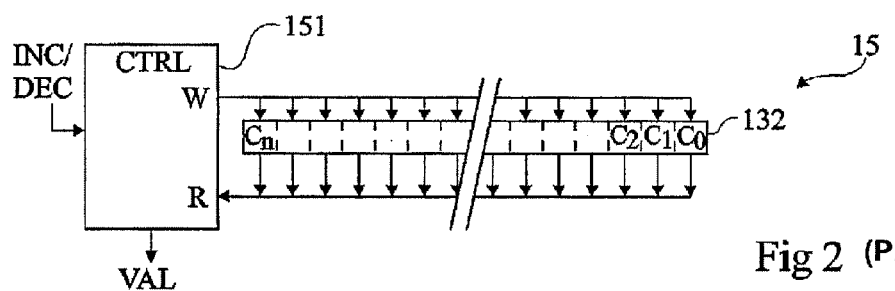
FIG. 2, previously described, very schematically shows in the form of blocks a conventional example of a counter.

The same elements have been designated with the same reference numerals in the different drawings. For clarity, only those circuit elements and method steps which are useful to the understanding of the present invention have been shown in the drawings and will be described hereafter. In particular, the circuit or program conditioning the updating of the counter value has not been described in detail, the present invention being compatible with any conventional circuit or program triggering an increment or a decrement of an event counter. Further, the exploitation that is made of the counter value, be it per se or with respect to a threshold, has not been described, the present invention being here again compatible with all conventional exploitations of an event counter.

A feature of an embodiment of the present invention is to divide the set of memory cells of the counter into words of several cells of identical sizes and to obtain the result of the counter value by an arithmetic summing of the respective values of the different words.

Another feature of an embodiment of the present invention is to organize the updating of the values of the different words so as to keep between one another a fixed interval (preferably, unity). As will be seen hereafter, this interval conditions the tolerance of the counter result.

Another feature of an embodiment of the present invention is to consider any word having a value which does not respect the given interval with respect to the other words as containing a functionally defective cell, and to then consider, at least in read mode, that it contains one of the two end values of the range of values set by this interval.

The present invention takes advantage from the fact that, in most event counter applications, it is not necessary to be accurate to within one.

Figure 3:
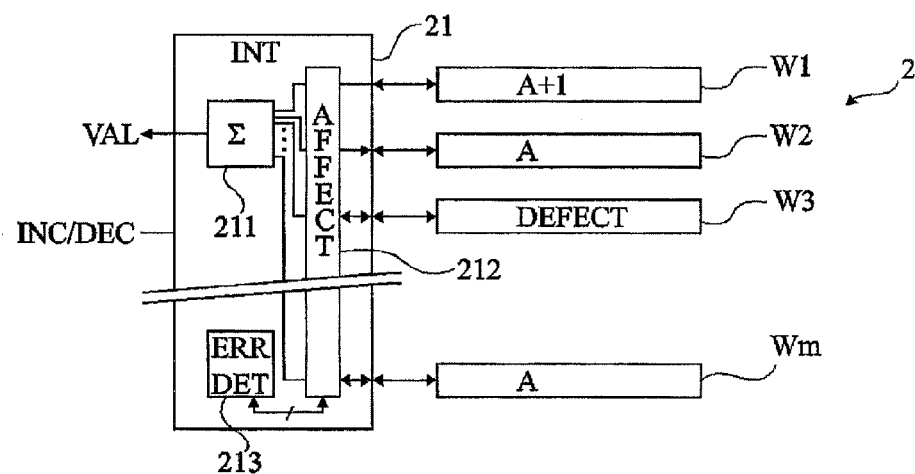
FIG. 3 very schematically shows in the form of blocks an embodiment of an event counter according to the present invention.

FIG. 3 very schematically shows in the form of blocks an embodiment of an event counter 2 according to the present invention. This counter uses several groups or words of memory cells W1 to Wm. These different words are exploited by an interpretation circuit 21 containing at least one function 211 of arithmetic summing ($\Sigma$) of the values contained in the different words. The result of this summing provides value VAL of the counter. Circuit 21 receives an increment or decrement signal INC/DEC (for example originating from a central processing unit (11, FIG. 1)). Functionally, circuit 21 comprises a function 212 (AFFECT) for assigning to possible words containing one or several defective cells (even temporarily), one of the values contained by the other valid words. The detection is performed by a block 213 (ERR DET) which scans the different values of words Wi (i ranging between 1 and m) to compare this value with a range of values conditioned by the tolerance desired by the counter. For example, for a counter having unity as an increment or decrement step, and since the updating of the different words is organized so that their respective contents do not differ by more than one with respect to one another, a word is considered as defective if its reading does not provide one of the two possible values taken by the other words.

In the example of FIG. 3, it is assumed that the valid counter words (for example W1, W2, and Wm in the representation) respectively contain values A+1, A, and A, where A represents an integer, and that word W3 comprises a defective cell resulting in that the read value DEFECT corresponds neither to A nor to A+1. Word W3 is detected by circuit 213, which compares the respective contents of the different words with respect to values A and A+1.

The fact for a word to contain an erroneous value does not prevent its taking into account for the counter result. Indeed, as will be better understood hereafter in relation with FIGS. 4 and 5, according to whether the result of the counter is exploited in relation to a decrease or an increase in the number of events, circuit 212 assigns to the erroneous word (W3 in this example), either value A or value A+1 to take it into account in summing 211.

Number m of words Wi conditions the counter tolerance on the provided general result. Noting ERR the number of words considered as containing defective cells on reading and PAS the increment or decrement step of the counter, value VAL represents the result plus or minus ERR*PAS.

The implementation of the present invention theoretically requires a number of memory cells greater than that of a conventional counter. Indeed, to form the equivalent of a counter over n bits (counting up to $2^n$), the implementation of the present invention requires k*n bits, where k is a constant which determines the number of defective or incompletely-updated cells. The economy in redundancy cells and the simplification of the defective cell management justifies, in practice, this size increase.

The present invention will be described hereafter with an example of a unity step of the counter. It should however be noted that it more generally applies to increment or decrement values different from unity provided that this value is compatible with the desired tolerance on the variation of the general value.

Figure 4:
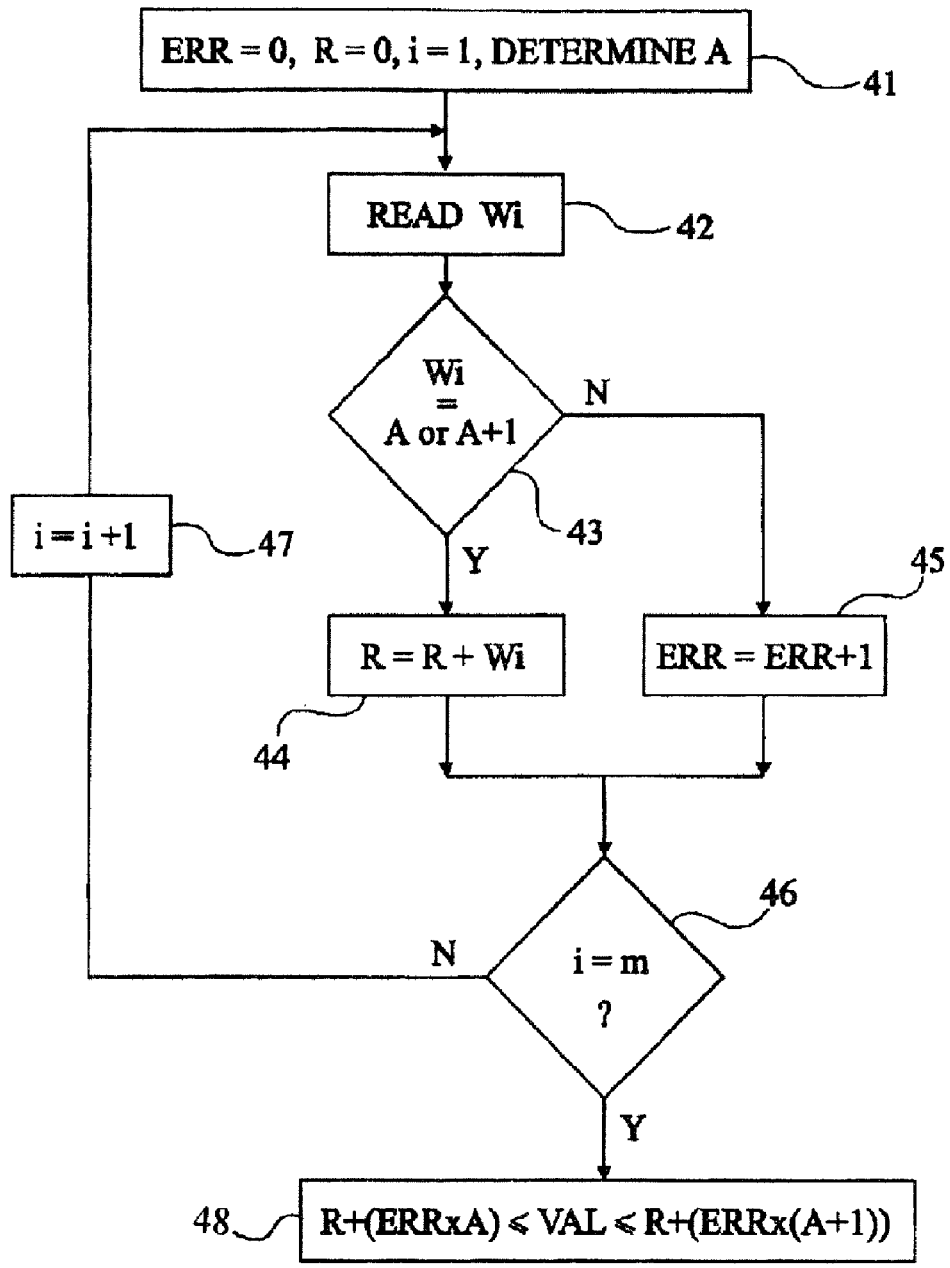
FIG. 4 is a simplified flowchart of the reading of a counter according to an embodiment of the present invention.

FIG. 4 very schematically illustrates in a simplified flowchart an embodiment of the present invention in a mode of reading of the value of a counter such as shown in FIG. 3.

It is started (block 41, ERR=0, R=0, i=1, DETERMINE A) by initializing the reading by setting to zero the value of an accumulator R (for example, a register), the value of a defective word counter ERR, a word index i, and by determining the current value A of some of the valid words. Value A varies along with the counter incrementation or decrementation but all the valid words contain either value A, or value A+1. Value A varies along with the counter lifetime. If all valid words Wi contain a same value, this value is considered as represented by A. If valid words contain a value and the other valid words this value plus 1, the lowest value is considered as represented by A. The determination of value A is performed, for example, by searching the most frequent pair of consecutive values (A, A+1) from among words Wi and by taking the smallest value A in the pair. The maximum of the possible values may also be searched and this value can be considered as being A+1. If no value A exists among words Wi, it is then considered that value A is the encountered maximum.

Once the initializations are over, several iterations of a loop for reading different words aiming at accumulating their respective results are performed. On each iteration of this loop, it is started by reading (block 42, READ Wi) the value contained by word Wi. It is then checked (block 43, Wi=A OR A+1) whether this value is contained in the authorized range set by the current value A. If so (output Y of block 43), the value A or A+1 contained in word Wi is added to result register R (block 44, R=R+Wi). If not (output N of block 43), erroneous word counter ERR is incremented (block 45, ERR=ERR+1). This counter is, for example, contained in a register.

As long as total number m of words has not been read (block 46, i=m ?), word index i is incremented (block 47, i=i+1) and it is returned to read step 42. Once all words Wi have been scanned (output Y of block 46), value VAL of the counter is given as ranging between R+(ERR*A) and R+(ERR*(A+1)).

As a variation, the result (block 48) of value VAL is directly estimated by setting for the words containing a defective cell an increment by A or A+1 according to whether it is desired to monitor an upward or downward exceeding of a threshold of the counter. In this case, counter ERR may be omitted and step 45 is replaced with a step of addition of value A or A+1 to result register R.

In practice, the interpretation of the counter words may be performed in parallel or successively with hardware and/or software means.

Figure 5:
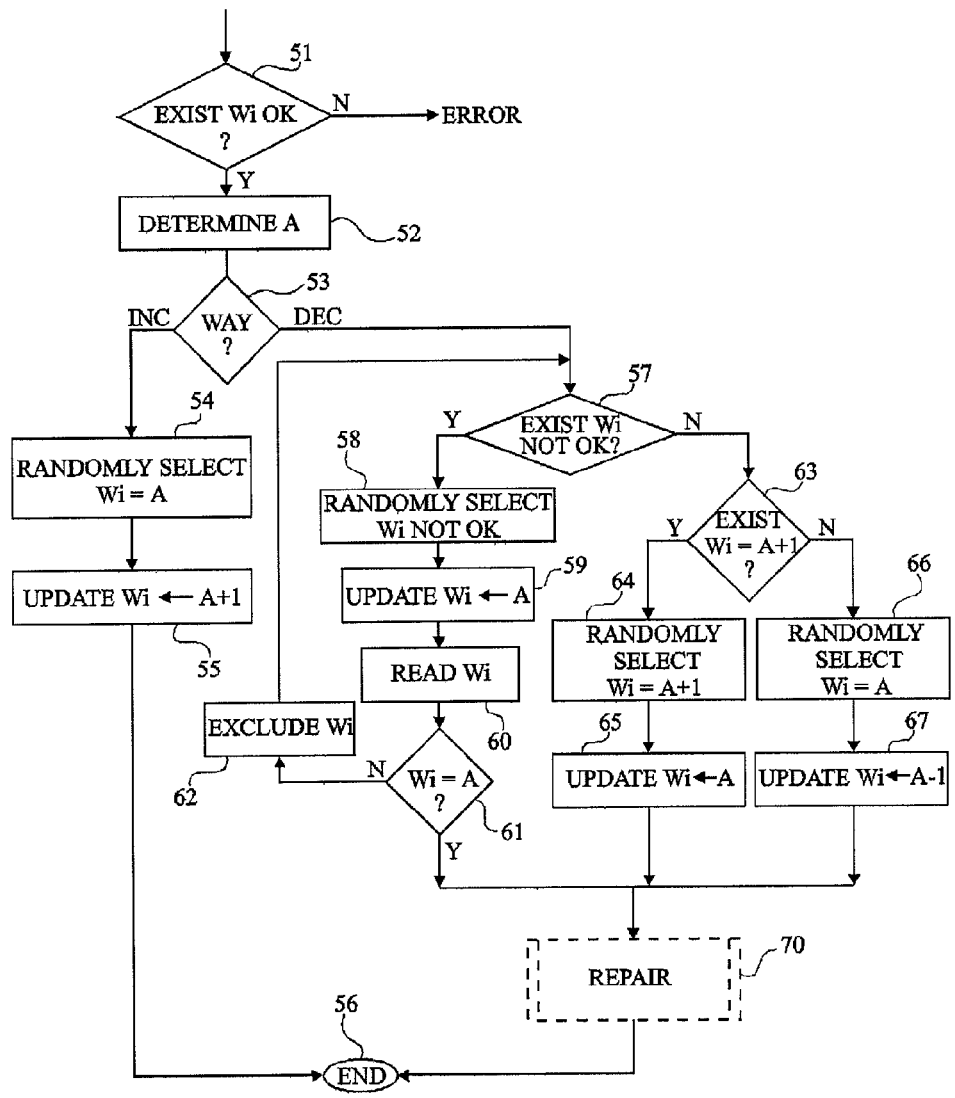
FIG. 5 is a simplified flowchart of an updating of the value of a counter according to an embodiment of the present invention.

FIG. 5 shows, in the form of a simplified flowchart, an embodiment of the method of the present invention for the updating by increment or decrement of a counter such as illustrated in FIG. 3.

It is started (block 51, EXIST Wi OK?) by making sure that there exists a non-defective word (that there exists at least one readable word).

If not (output N of block 51), an error processing (ERROR) is implemented, the counter being unusable.

If such a word exists (output Y of block 71), as for the reading, the value A contained in the non-defective words is determined (block 52, DETERMINE A).

According to instruction INC/DEC received by circuit 21 (block 53, WAY ?), the counter is incremented or decremented.

For an increment (output INC of block 53), one of the words Wi of the counter containing value A is randomly selected (block 54, RANDOMLY SELECT Wi=A). There necessarily exists such a word from the moment that all the words are not defective. This word is updated (block 55, UPDATE Wi←A+1) by being incremented by 1 so that it contains value A+1. The write process is then over (block 56 END).

To decrement the counter (output DEC of block 53), it is started by determining whether there exists a defective word Wi (block 57 EXIST Wi NOT OK ?).

If so, one of the defective words is randomly selected (block 58, RANDOMLY SELECT Wi NOT OK) and it is attempted to repair it by updating it to value A (block 59, UPDATE Wi←A). Then, the repair is verified by reading the content of the word which has just been written (block 60, READ Wi) and by comparing its content with value A (block 61, Wi=A ?). If the word contains value A (output Y of block 61), the write process is then over (block 56). In the opposite case (output N of block 61), the word is excluded (block 62, EXCLUDE Wi) from the word range taken into account for the current write operation.

If all words are correct (output N of block 57), it is checked (block 63, EXIST Wi=A+1) whether one of the words contains value A+1. If so (output Y of block 63), one of these words is selected (block 64, RANDOMLY SELECT Wi=A+1) to be updated (block 65, UPDATE Wi←A) to value A by decrementing it. The decrement operation is then over (block 56). If no word contains value A+1 (output N of block 63), this means that all the words contain the same value (A). Any of the words is selected (block 66, RANDOMLY SELECT Wi=A) and updated (block 67, UPDATE Wi←A−1) to value A−1 and the decrement operation is ended (block 56). In this last case, at the next determination of value A, said value is decreased by 1.

Optionally (and if the available execution time enables it), each counter decrement goes along with an attempt to repair all defective words (block 70, REPAIR).

Figure 6:
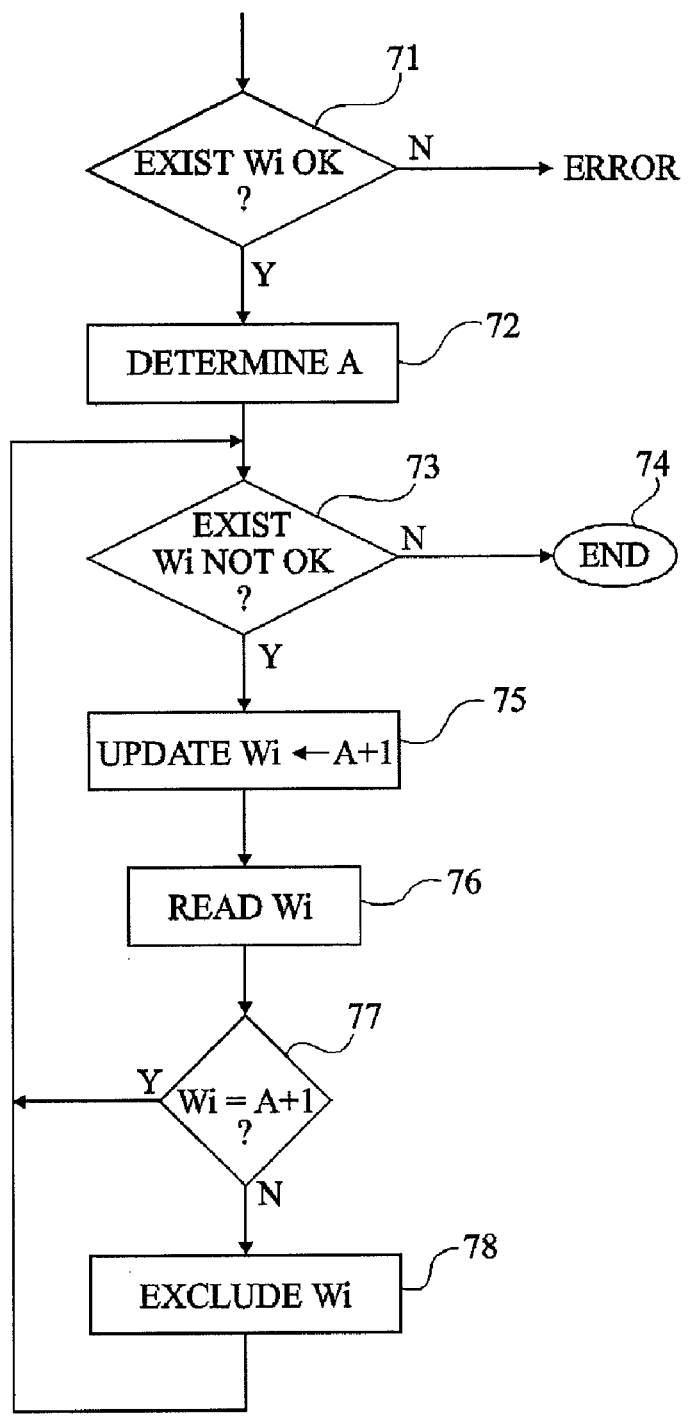
FIG. 6 is a simplified flowchart of a mechanism for checking the counter according to an embodiment of the present invention.

FIG. 6 is an example of a simplified flowchart of a subprogram 70 for attempting to systematically repair defective or incoherent words. This sub-program can be executed, for example, at the end of a decrement operation (FIG. 5) and/or periodically independently from the operations on the counter.

It is started (block 71, EXIST Wi OK?) by scanning the counter words to determine whether there exists at least one readable word.

If not (output N of block 71), an error processing (ERROR) is implemented, the counter being unusable.

If such a word exists (output Y of block 71), the value A contained in the non-defective words is determined (block 72, DETERMINE A).

Then, it is determined, by scanning all the words, whether there exists a defective word Wi (block 73, EXIST Wi NOT OK?).

If not (output N of block 73), the subprogram is ended (block 74, END).

If such a word exists (output Y of block 73), it is attempted to repair the found defective word by updating it to value A+1 (block 75, UPDATE Wi←A+1). Then, the repair is verified by reading the content of the word which has just been written (block 76, READ Wi) and by comparing said content with value A+1 (block 77, Wi=A+1 ?). If the word contains value A+1 (output Y of block 77), the repair has been effective and it is returned to the entrance of block 73 to end the word scanning. In the opposite case (output N of block 77), the current word is excluded (block 78, EXCLUDE Wi) from the word range taken into account for the current write operation or is replaced with a redundant word and it is returned to the entrance of block 73 to end the word scanning.

An advantage of the present invention is that the counter operates even with defective cells since the words containing defective cells are self-compensated by those containing operative cells. An advantage of the present invention is that it, in a way, virtually increases the redundancy capacity of the non-volatile memory.

Another advantage of the present invention is that it improves the lifetime of event counters without requiring an increase in the number of possible redundancy cells. The present invention however remains compatible with the use of redundant cells. Indeed, if a cell considered as defective cannot be repaired by a writing, a conventional redundancy method can then be implemented. In this case, an advantage of the present invention is that it decreases the number of redundancy cells required for the same counter capacity.

Another advantage of the present invention is that the event counter is protected against possible fraud attempts or incidental disturbances.

Another advantage of the present invention is that it simplifies the detection of a possible defective cell by bringing this detection down to the word level.

Of course, the present invention is likely to have various alterations, modifications, and improvements which will readily occur to those skilled in the art. In particular, the present invention applies to an increment different than one, the only consequence being that this increases the counter tolerance. The maximum error then corresponds to the number of words of the counter multiplied by the possible interval between the two extreme values likely to be contained in each word.

Further, although the present invention has been described in relation with an example applied to the case where the total result of the counter is overestimated, that is, by assigning value A+1 (more generally, the upper value of the range of values of the words considered as defective), it of course also applies to an overestimation of the total result by assigning value A (more generally, the lowest value of the range of values) to the words considered as defective.

Moreover, the implementation of the present invention, be it by software or hardware means, is within the abilities of those skilled in the art based on the functional explanations given hereabove.

Having thus described at least one illustrative embodiment of the invention, various alterations, modifications, and improvements will readily occur to those skilled in the art. Such alterations, modifications, and improvements are intended to be within and scope of the invention. Accordingly, the foregoing description is by way of example only and is not intended as limiting. The invention is limited only as defined in the following claims and the equivalents thereto.

What is claimed is:

1. A counting method using a memory area in an integrated circuit, comprising storing partial values of a count value in several memory words of identical sizes, the memory words included in the memory area, and arithmetically adding the partial values contained in the several memory words to obtain the count value.

2. The method of claim 1, comprising the step of incrementing or decrementing one of the words by selecting it so that all the words contain values present within a given range.

3. The method of claim 2, wherein said range is set according to the tolerance desired for the counter value.

4. The method of claim 2, wherein the increment or the decrement is one.

5. The method of claim 1, wherein, if a word does not contain one of a range of values, attempting an updating of this word to one of these values.

6. An integrated circuit counter comprising a memory area to store a counter value, comprising:

means for comparing partial values contained in different memory words of identical sizes with respect to a range of possible values, the memory words included in the memory area;
means for assigning to words having their value outside the range one of the values of this range; and
means for arithmetically summing up the respective values of the words to provide the counter value.

7. The counter of claim 6, wherein the range of values is selected according to the maximum interval desired between the resulting values of the counter.

8. A method for counting using a memory area in an integrated circuit, comprising:

defining a plurality of words in the memory area; and
incrementing or decrementing a count value by incrementing or decrementing one of the plurality of words such that each of the words contains a partial value within a given range.

9. A method as defined in claim 8, further comprising:
reading the count value by adding the partial values in the plurality of words.

10. A method as defined in claim 9, wherein reading the count value comprises, if a current word contains a partial value A or A+1, adding the value of the current word to an intermediate result register, and, if the current word does not contain the partial value A or A+1, incrementing an error value.

11. A method as defined in claim 8, wherein incrementing the count value comprises determining that at least one word in the plurality of words contains a partial value in a range A to A+1, selecting a word that is determined to contain the partial value A, and updating the selected word to the partial value A+1.

12. A method as defined in claim 11, wherein decrementing the count value comprises determining if one or more of the words contains the partial value A+1, if one or more of the words is determined to contain the partial value A+1, selecting one of the words containing the partial value A+1 and updating the selected word to the partial value A, and, if none of the words is determined to contain the partial value A+1, selecting a word containing the partial value A and updating the selected word to a partial value A−1.

13. A method as defined in claim 12, wherein decrementing the count value further comprises determining if one or more of the words is defective, if one or more of the words is determined to be defective, selecting one of the defective words, updating the selected defective word to the partial value A and verifying that the updated defective word contains the partial value A, otherwise excluding the updated defective word.

14. An integrated circuit counter comprising:
a memory area having a plurality of words; and
a control circuit including:
an increment/decrement circuit configured to increment or decrement a count value by incrementing or decrementing one of the plurality of words such that each of the words contains a partial value within a given range; and
a summing circuit configured to add the partial values in the plurality of words to obtain the count value.

15. An integrated circuit counter as defined in claim 14, wherein the increment/decrement circuit is configured to increment the count value by determining that at least one word in the plurality of words contains a partial value in a range A to A+1, selecting a word that contains the partial value A, and updating the selected word to the partial value A+1.

16. An integrated circuit counter as defined in claim 15, wherein the increment/decrement circuit is further configured to decrement the count value by determining if one or more of the words contains the partial value A+1, if one or more of the words is determined to contain the partial value A+1, selecting one of the words containing the partial value A+1 and updating the selected word to the partial value A, and, if none of the words is determined to contain the partial value A+1, selecting a word containing the partial value A and updating the selected word to the partial value A−1.

17. An integrated circuit counter as defined in claim 16, wherein the increment/decrement circuit is further configured to decrement the count value by determining if one or more of the words is defective, if one or more of the words is determined to be defective, selecting one of the defective words, updating the selected defective word to the partial value A and verifying that the updated defective word contains the partial value A, otherwise excluding the updated defective word.

18. An integrated circuit counter as defined in claim 14, further comprising an intermediate result register, wherein the summing circuit is configured, if a current word contains a partial value A or A+1, to add the value of the current word to the intermediate result register, and, if the current word does not contain the partial value A or A+1, to increment an error value.

* * * * *